United States Patent
Teich et al.

(10) Patent No.: US 9,632,108 B2
(45) Date of Patent: *Apr. 25, 2017

(54) METHOD FOR VERIFYING A TEST SUBSTRATE IN A PROBER UNDER DEFINED THERMAL CONDITIONS

(71) Applicant: CASCADE MICROTECH, INC., Beaverton, OR (US)

(72) Inventors: Michael Teich, Friedewald (DE); Stojan Kanev, Thiendorf OT Sacka (DE); Hans-Jurgen Fleischer, Priestewitz (DE)

(73) Assignee: HSBC Bank USA, National Association, San Francisco, CA (US)

( * ) Notice: Subject to any disclaimer, the term of this patent is extended or adjusted under 35 U.S.C. 154(b) by 72 days.

This patent is subject to a terminal disclaimer.

(21) Appl. No.: 14/243,640

(22) Filed: Apr. 2, 2014

(65) Prior Publication Data

US 2014/0239991 A1 Aug. 28, 2014

Related U.S. Application Data

(63) Continuation of application No. 13/119,145, filed as application No. PCT/EP2009/059962 on Jul. 31, 2009, now Pat. No. 8,692,567.

(30) Foreign Application Priority Data

Sep. 15, 2008 (DE) .................. 10 2008 047 337

(51) Int. Cl.
*G01R 31/28* (2006.01)
*G01R 1/04* (2006.01)

(52) U.S. Cl.
CPC ....... *G01R 1/0408* (2013.01); *G01R 31/2855* (2013.01); *G01R 31/2874* (2013.01); *G01R 31/2886* (2013.01); *G01R 31/2875* (2013.01)

(58) Field of Classification Search
None
See application file for complete search history.

(56) References Cited

U.S. PATENT DOCUMENTS 5,325,052 A 6/1994 Yamashita
6,492,822 B2 12/2002 Schwindt et al.
(Continued)

FOREIGN PATENT DOCUMENTS

DE 298 20 106 1/1999
DE 10 2007 053 862 6/2008

OTHER PUBLICATIONS

Data Sheet for PA300PS from SUSS MicroTec, Sep. 23, 2008.
(Continued)

*Primary Examiner* — Paresh Patel
(74) *Attorney, Agent, or Firm* — Dascenzo Intellectual Property Law, P.C.

(57) ABSTRACT

A method and an apparatus for verifying or testing test substrates, i.e. wafers and other electronic semiconductor components, in a prober under defined thermal conditions. Such a verifying apparatus, known to the person skilled in the art as a prober, has a housing having at least two housing sections, in one housing section of which, designated hereinafter as test chamber, the test substrate to be verified is held by a chuck and is set to a defined temperature, and in the other housing section of which, designated hereinafter as probe chamber, probes are held. For verification purposes, the test substrate and the probes are positioned relative to one another by means of at least one positioning device and the probes subsequently make contact with the test substrate.

22 Claims, 2 Drawing Sheets

(56) References Cited

U.S. PATENT DOCUMENTS

Figure 1:
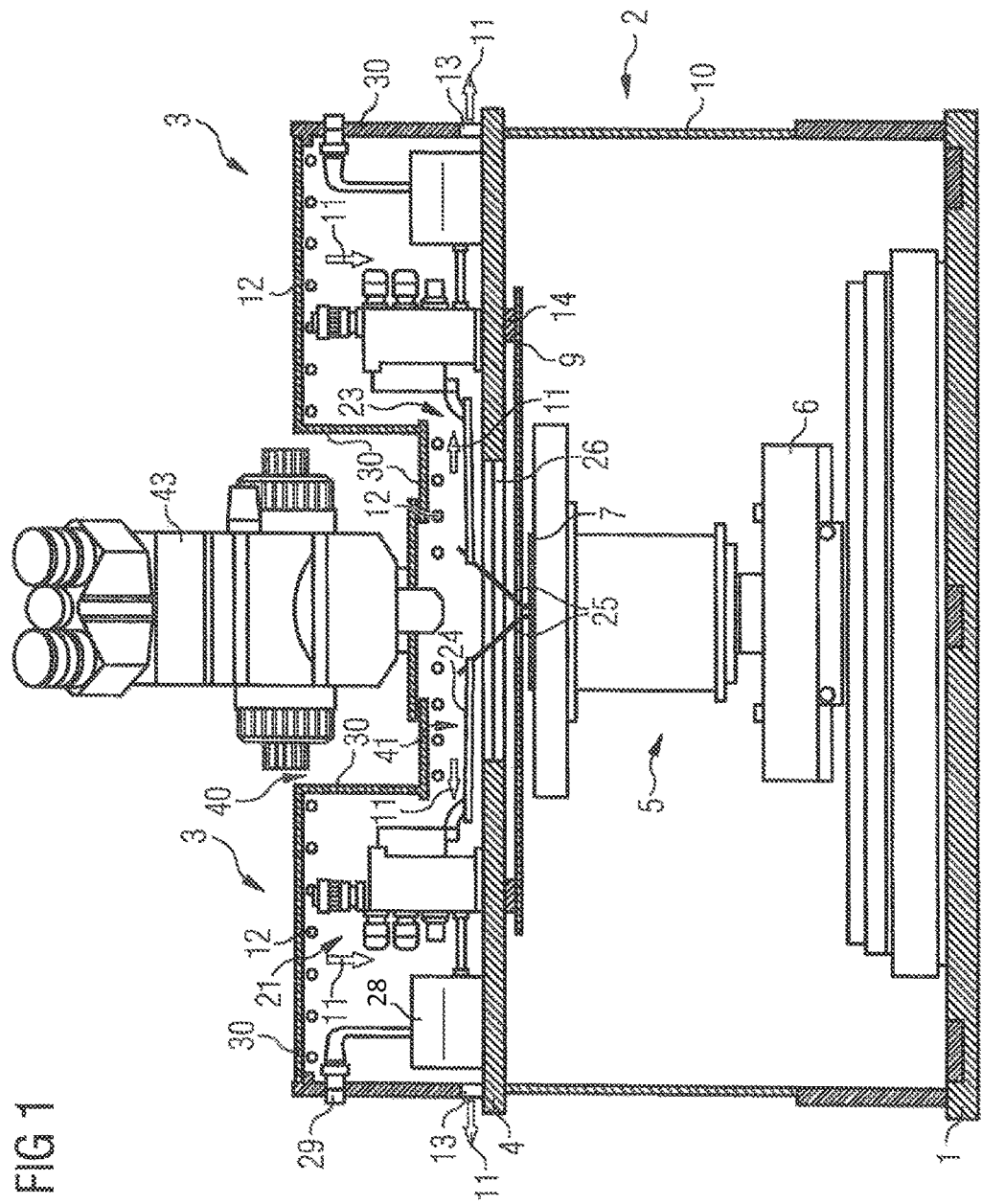

| | | |
|---|---|---|
| 7,671,615 B2 | 3/2010 | Van de Beek et al. |
| 7,900,373 B2 | 3/2011 | Reitinger |
| 8,278,951 B2 | 10/2012 | Kanev et al. |
| 8,497,693 B2 | 7/2013 | Kiesewetter et al. |
| 8,692,567 B2 * | 4/2014 | Teich et al. .............. 324/750.03 |
| 2008/0116918 A1 | 5/2008 | Kanev et al. |
| 2011/0291680 A1 * | 12/2011 | Rumiantsev et al. ... 324/750.02 |

OTHER PUBLICATIONS

Overview Sheet for PA300PS from SUSS MicroTec.
Fact Sheet for PA300PS from SUSS MicroTec, Apr. 3, 2008.
Machine translation of German Patent No. DE 10 2007 053 862 A1, Jun. 12, 2008.
English-language abstract of German Patent No. DE 10 2007 053 862 A1, Jun. 12, 2008.

* cited by examiner

METHOD FOR VERIFYING A TEST SUBSTRATE IN A PROBER UNDER DEFINED THERMAL CONDITIONS

CROSS-REFERENCE TO RELATED APPLICATIONS

This application is a continuation of U.S. patent application Ser. No. 13/119,145, filed on Jun. 20, 2011, issued as U.S. Pat. No. 8,692,567 on Apr. 8, 2014, and which is a U.S. National Stage application of International Patent Application No. PCT/EP2009/059962, filed Jul. 31, 2009, which claims priority to German Patent Application No. DE 10 2008 047 337.5, filed Sep. 15, 2008, and is incorporated by reference herein.

BACKGROUND OF THE INVENTION

The invention relates to a method and an apparatus for verifying or testing test substrates, i.e. wafers and other electronic semiconductor components, in a prober under defined thermal conditions. Such a verifying apparatus, known to the person skilled in the art as a prober, has a housing having at least two housing sections, in one housing section of which, designated hereinafter as test chamber, the test substrate to be verified is held by a chuck and is set to a defined temperature, and in the other housing section of which, designated hereinafter as probe chamber, probes are held. For verification purposes, the test substrate and the probes are positioned relative to one another by means of at least one positioning device and the probes subsequently make contact with the test substrate.

For particular test tasks, in particular for the measurement of very small currents, it is necessary to prevent interfering influences on the measuring arrangement which can corrupt the measurement results. Such an arrangement has for such tests a shielding system that can be used to minimize the electromagnetic influencing (EMI) of the measurement of the test substrates. A prober with electromagnetic shielding is known from DE 298 20 106 U1, which describes that an assembly for receiving the test substrates including the positioning unit thereof and also an assembly for receiving and positioning probes are shielded with a housing from the external electromagnetic influences. The cables to the control and evaluation units constitute the interfaces toward the outside. An optical and an electromagnetic shielding of the measuring equipment are thus obtained. A shielding with respect to low-frequency magnetic fields also proves to be particularly problematic. Such a low-frequency shielding can be obtained by means of thick-walled housings composed of ferromagnetic materials. However, accesses to such walls cannot be realized without significantly weakening the shield.

The problem of such housings is, however, the accessibility to individual components, in particular to the positioning units of the probes and/or the mount of the test substrate, generally designated as chuck. In U.S. Pat. No. 6,492,822 B2, therefore, parts of both positioning units are lead through the housing wall toward the outside, such that the manipulation thereof is possible from the outside without opening the housing. Such housing entrances prove to be disadvantageous, however, since they constitute an interruption of the shield.

DE 10 2007 053 862 A1 discloses a prober, the housing of which is subdivided in such a way that both the chuck with its chuck positioning unit and the probe mounts with the positioning units thereof are integrated in the shielding housing. The integration of such or comparable apparatuses and the cables thereof into the electromagnetic shielding system is effected in such a way that mutual influencing of the apparatuses and of the test substrate can be minimized even within the system. Despite the complex and variable shielding system, the individual components to be operated during a measurement cycle, such as e.g. the positioning unit of the chuck and also, if appropriate, of the probes, are accessible and observation of the test substrate during the measurement is possible. By way of example, the probe mounts are accessible by individual housing sections being open, while the housing section that directly surrounds the test substrate remains closed.

The configuration of the housing with a plurality of housing sections to be opened individually and the thus possible good accessibility of individual components of the prober with minimized interruption of the shield also allows the inclusion of an apparatus for signal conditioning, e.g. for signal preprocessing or for signal processing, into the electromagnetic shielding of the housing. Therefore, e.g. such cables which act as an antenna outside the housing and can corrupt the measurement can also be integrated into the shield of the housing. The prober proposed in DE 10 2007 053 862 A1 also encompasses the possibility of configuring the shielding system for shielding against low-frequency magnetic fields. Such shielding is obtained by means of housings or housing sections composed of thick-walled, ferromagnetic materials.

In the prober, a test substrate is arranged on the chuck and moved by means of the positioning unit of the chuck, generally also designated as chuck drive, in the working region, such that it is positioned relative to the probes of the prober. The test substrate is generally positioned in the horizontal, i.e. X Y, plane by means of a compound table and also by means of an apparatus for angular orientation and by means of a vertical, i.e. Z, advancing drive, which enables e.g. a feed movement of the test substrate in the direction of the probes arranged above the test substrate. By means of the positioning units of the probes, also designated as probe heads, a plurality of probes can be moved relative to one another or to a preferred direction of the test substrate in the X, Y and Z directions or in a feed movement to the test substrate. In alternative configurations, the probes are fixedly mounted.

For verification purposes, the probes, having the form of contact-making needles, make contact with the test substrate and verification signals are applied to or tapped off from said test substrate. The probes including the probe heads are generally situated outside the working region on a plate which upwardly delimits the working region and which often also serves for the mounting of the probes and in this case is designated as a probe mounting plate. The tips of the probes make contact with the test substrate through an opening in the plate, in which case, in order to optimize the electromagnetic shielding, the opening itself is made as small as possible or is supplemented by an electromagnetic shield, which is arranged above the test substrate and below the plate and has the necessarily small opening for the probes to reach through.

In probers, electronic components are verified with regard to their functional reliability preferably under the ambient conditions which correspond to the use conditions of the respective component, wherein the setting of the test substrate to defined temperatures usually in the range up to a few hundred degrees Celsius constitutes a main emphasis.

The temperature of the test substrate is set by means of the chuck, which can be heated or cooled by means of suitable apparatuses.

It has been found however, that, via the plate that upwardly delimits the working region, and in particular via the opening therein and likewise via the contact of the probes with the test substrate, a heat exchange takes place between the working space and the overlying housing section, in which the probe mounts, the probe heads and also, if appropriate, the apparatus for signal conditioning are arranged and which shall be designated hereinafter as probe chamber.

Particularly in the case of relatively large temperature differences with respect to the ambient temperature, e.g. in the case of measurement temperatures of a few hundred degrees Celsius, all components and apparatuses arranged in the probe chamber are heated to such a temperature, which prevent, or at least make more difficult, exact positioning of the probes or maintenance of the position thereof over a relatively long verification period. This is because heating or cooling of the probe heads and also of the probes leads to drift phenomena on account of thermal expansion in the course of the measurement, these effects being intensified with the length of the verification tips. If the apparatuses for signal conditioning are arranged in a probe chamber, their electrical parameters are also altered and the measurement is corrupted. Furthermore, the housing of a probe chamber can also heat up to such a great extent that combustion can occur upon contact with the housing.

In order to overcome these problems, a prober is specified in which, in a housing section which lies outside the working region and encompasses at least one probe and the probe mount thereof, a temperature that is independent of the temperature of the test substrate is set by means of a temperature-regulated gas flow that flows through this housing section. The independent temperature setting of test substrate and probes makes it possible, in a manner dependent e.g. on the test temperature, on the thermal properties of the probes and/or on the type of test, to set the probes to such a temperature which either minimally influences the test substrate, maintains the positioning of the probes even for long-term tests, and/or to ensure the constant function of sensitive further components of the prober which are connected to the probes. Thus, e.g. even at very high or low test temperatures, the probes and the surroundings thereof such as e.g. signal conditioning apparatuses in the probe chamber can be set to the ambient temperature of the prober. It is nevertheless possible to maintain the temperature of the test substrate by means of suitable further measures described below.

The invention will be explained in greater detail below on the basis of an exemplary embodiment.

BRIEF DESCRIPTION OF THE SEVERAL DRAWINGS

Figure 2:
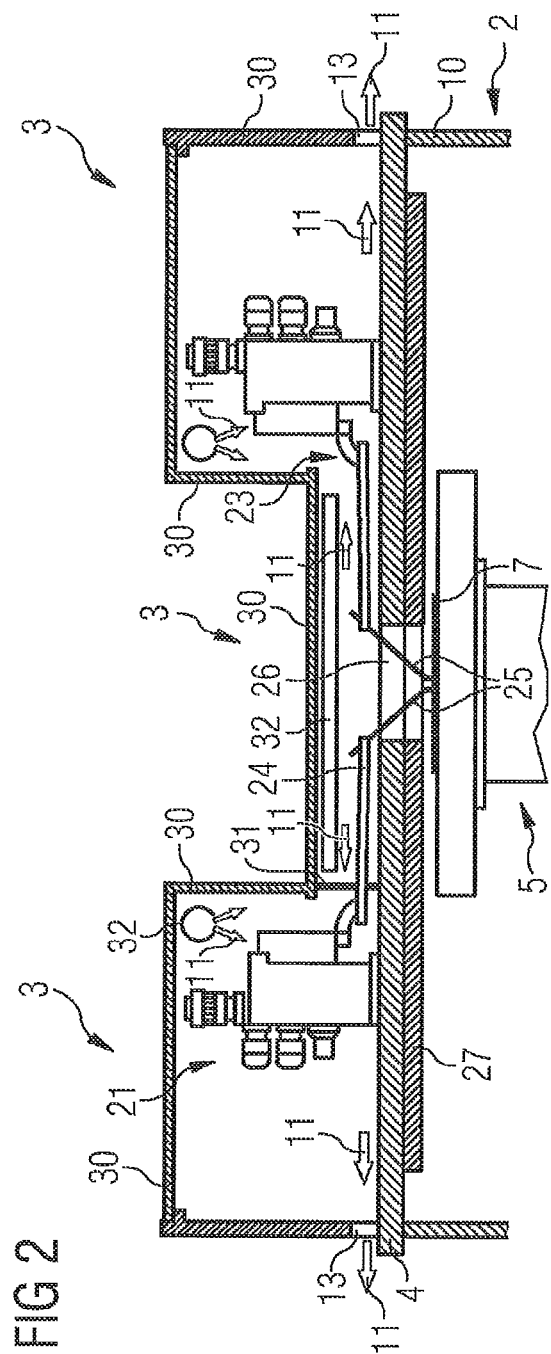
Figure 3:
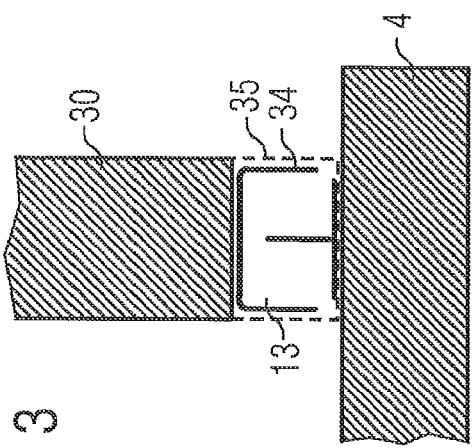

FIG. 1 shows a prober with a housing in a frontal sectional illustration, wherein the housing is subdivided into two housing sections by a sample mounting plate, FIG. 2 shows a further configuration of housing sections arranged above a probe mounting plate in sectional illustration and FIG. 3 shows a detail illustration of a gas outlet in the housing wall.

DETAILED DESCRIPTION OF PREFERRED EMBODIMENTS

An embodiment of a prober as illustrated in FIG. 1 has a housing having two housing sections. A chuck 5 is arranged in the lower of the two housing sections, a test substrate 7 being placed and held on said chuck. Chuck 5 is generally understood to be a particular holding apparatus for test substrates 7 which is adapted to their particular mechanical, electrical and geometrical requirements and realizes suitable holding mechanisms in accordance with the test substrate 7 and the verification. A chuck 5 regularly comprises a chuck positioning unit 6, by means of which the chuck 5 can be moved in the X, Y and Z directions and can be rotated about the Z axis in a certain angular range. The chuck 5 including its chuck positioning unit 6 is mounted on a baseplate 1 of the prober and surrounded laterally by a lower housing wall 10. By means of a coolable or heatable chuck 5, the test substrate 7 is set to the test temperature and held during the entire test duration.

Arranged opposite the chuck 5 and at the same time the test substrate 7 is a probe mounting plate 4, which upwardly terminates the lower housing wall 10 and thus forms the lower housing section. This lower housing section encloses the chuck 5, the chuck positioning unit 6 and the test substrate 7 and shall therefore be designated hereinafter as test chamber 2, for the sake of better differentiation. The lower housing wall 10, the baseplate 1 and the probe mounting plate 4 consist of an electrically conductive material and realize, if appropriate in a manner supplemented by a specific construction of the chuck 5, the electromagnetic shielding of the test substrate 7.

The upper housing section extends above the probe mounting plate 4, the wall of said upper housing section, for the electromagnetic shielding of the components arranged therein, likewise consisting of electrically conductive material. Consequently, the probe mounting plate 4 subdivides the housing of the prober into a lower housing section and an upper housing section, wherein both housing sections realize electromagnetic shielding with respect to the surroundings and with respect to the other housing section in each case. The individual housing parts and the probe mounting plate are electrically connected to one another via their surface contacts, such that closed shielding is obtained. In a further configuration, the housing does not serve for electromagnetic shielding, but rather only for enclosing the test arrangement, e.g. for setting test conditions that deviate from the ambient conditions.

A central opening 26 is arranged in the probe mounting plate 4, through which opening the probes 23 mounted on the probe mounting plate 4 by means of probe heads 21 make electrical contact with the test substrate 7. Probe heads 21 are generally understood to be mounts which hold the probes 23 either individually or in a manner arranged on so-called probe cards in their defined position with respect to the probe mounting plate 4 and with respect to the further probes 23 and realize the electrical connection to the probes 23.

The central opening 26 in the probe mounting plate 4 constitutes an opening in the shielding of the test chamber 2 toward the top and also of the upper housing section toward the bottom. In the embodiment illustrated, this opening is virtually completely closed by a shield 9, which extends between the probe mounting plate 4 and the test substrate 7 and has an opening only in the region where the probe tips 25 directly make contact with the test substrate 7. Since the shield 9 supplements the shielding of the two housing sections that adjoin one another here, the shield 9 also consists of an electrically conductive material and is mounted on the probe mounting plate 4 by means of spacers 14.

This configuration is only one of many possible configurations. In one alternative configuration, the shielding of the two housing sections with respect to one another can be realized without a shield 9, by means of a suitable configuration of the probe mounting plate 4 or by means of a very extensive closure of the central opening 26. In another configuration, the separation of the test chamber 2 from one or more upper housing sections can be effected, instead of by means of the probe mounting plate 4, by means of a further housing wall, e.g. if the probes 23 are held and arranged in some other way.

The shielding between the two housing sections simultaneously also realizes the very extensive spatial separation thereof. In other configurations, the spatial separation, which, in accordance with the description below, reduces the influence of the temperature-regulated gas flowing through the probe chamber 3 on the test substrate, can also be effected by other suitable measures.

In the embodiment illustrated in FIG. 1, the probe chamber 3 is subdivided into two partial sections by an observation region 40 by virtue of the observation region 40 extending centrally and over the entire depth (viewed perpendicularly to the plane of the drawing) of the upper housing section and is lowered relative to the upper housing wall 30 to close to the probe mounting plate 4. The lowered observation region 40 is delimited toward the probe mounting plate 4 by the lowered part of the upper housing wall 30, which runs approximately parallel to and at such a distance from the probe mounting plate 4 that the probes 23 can extend in this distance without touching the probe mounting plate 4 or said lowered part. The objective of a microscope 43 projects into this central section, such that the production of the contact between probe tips 25 and test substrate 7 and the maintenance thereof during the test can be observed by means of the microscope 43. This central region is a constituent part of the probe chamber 3, but shall be designated hereinafter as objective chamber 41 for the sake of better differentiation.

Both partial sections of the probe chamber 3 each comprise a group of probe heads 21. Each probe head 21 receives a probe 23 and comprises a probe positioning unit 22, micrometer screw gauges in the present case, by means of which each probe 23 can be finely positioned individually in X, Y and Z directions. In alternative configurations of the prober, instead of the micrometer screw gauges, other, including electrically driven means for positioning the probes 23 can be arranged or the probes 23 are themselves not movable, such that contact is made with the test substrate 7 by the probes 23 by means of a feed movement performed by the chuck positioning unit 6 or by a movement of the entire probe mounting plate 4.

Directly alongside each group of probe heads 21 and thus within the probe chamber 3, an apparatus for signal conditioning 28 is in each case arranged on the probe mounting plate 4, such as e.g. a signal processing unit. Each apparatus for signal conditioning 28 is connected via a connector 29 to measuring arrangements or evaluation devices that are arranged outside the housing and not illustrated in more specific detail.

In order to produce a gas flow, the probe chamber 3 has, in each of its sections, gas inlets 12 distributed in the upper region and gas outlets 13 distributed in the lower region. Openings in the upper housing wall 30 and also a non-gas-tight connection of the upper housing wall 30 to the probe mounting plate 4 are possible as gas outlets 13, depending on the gas volumetric flow rate required for the temperature regulation of the probe chambers 3.

In one configuration, a gas flow 11 through the probe chamber 3 is already produced by the position and the distribution of the gas inlets 12 and gas outlets 13 on account of the thermal conditions. In another configuration, the flow direction can be supported by an extraction by suction at the gas outlets 13, such that the gas flow 11 does not penetrate into the test chamber 2 or a negligible proportion of said gas flow penetrates into said test chamber. Other suitable measures are also possible for this purpose, e.g. the production of a counterflow from the test chamber 2 into the probe chamber 3 or the minimization of passages between the two chambers, as described above.

The gas flow 11, before it is introduced into the probe chamber 3, is set to the required temperature, in which case both a heating of the gas and a cooling, e.g. by means of a Peltier cooler, can be effected. If the verification in the prober takes place at high temperatures, a cooling of the probes can also already be effected with a gas flow 11 at room temperature. For the gas flow 11 it is possible to use air, which can be dried, in order to avoid condensate in the probe chamber 3 or, if appropriate, on the test substrate 7 or the test chamber. Flushing with nitrogen can also be used, e.g. in order to prevent oxidation processes or in order to utilize the favorable heat transfer properties of nitrogen. Other gases can likewise be used taking account of the test conditions and the construction of the prober.

The gas flow 11 running through the probe chamber 3 from top to bottom in the embodiment according to FIG. 1 flows around and regulates the temperature of the probe heads 21 and also the apparatuses for signal conditioning 28. In this way, it is possible, for example, even at relatively high test temperatures of a few hundred degrees, to set the temperature of electronic components arranged in the probe chamber virtually to room temperature or to 25° C.±5 degrees, at which the functional parameters of said components are ensured.

On account of the gas inlets 12 distributed over the entire width of the probe chamber 3, there is a flow through the entire probe chamber 3 and the temperature thereof is regulated before the gas emerges from the probe chamber 3 through the lower gas outlets 13. In this case, that proportion of the gas flow 11 which flows through the central part of the probe chamber 3, which part serves as the objective chamber 41 and has a smaller height in the exemplary embodiment, brings about the temperature regulation of the probe arms 24. The latter are relatively long in the exemplary embodiment, such that a temperature drift, on account of the associated change in thermal expansion, would have a distinct effect in a drift of the position of the probe tips 25 on the test substrate 7. Such a drift can be avoided by the temperature regulation of the probes 23 by means of the gas flow 11 since the temperature regulation supports the maintenance of a thermal equilibrium—set before the measurement—in the entire system. This equilibrium temperature can be determined computationally or experimentally and can be used as a basis for the temperature regulation of the probes 23.

If, in a further configuration, instead of the needle-like probes 23, probe cards having a multiplicity of short probes are used, the probe card, which would be arranged parallel to the test substrate 7 in the central opening 26 in the probe mounting plate 4, can also be temperature-regulated by the gas flow 11 flowing past.

Furthermore, the gas flow 11 in the objective chamber 41 can also regulate the temperature of the objective, e.g. in order to prevent the slow adaptation thereof to the temperature of the test substrate 7 lying directly below the objective, and thus to ensure the continuous observation of the test.

In a further configuration, the test chamber 2 and/or the chuck positioning unit 6 can supplementarily also be temperature-regulated in order to avoid changes in the position of the test substrate 7 or the electrical properties thereof as a result of a temperature drift.

FIG. 2 shows a further configuration of the probe chamber 3 of the prober. The essential construction of the illustrated part of the prober corresponds to that in FIG. 1, for which reason reference is made to the explanations in respect thereof. The same components of the prober have been identified by the same reference symbols. For the sake of better clarity, no observation device is illustrated. However, there is freedom to enable the probe tips 25 to be observed during the verification in another suitable manner. The configuration in accordance with FIG. 2 furthermore differs from that illustrated in FIG. 1 in that no shield 9 is arranged below the probe mounting plate 4. In order nevertheless to reduce the thermal influence of the test substrate 7 and of the chuck 5 on the probe chamber 3, the central opening 26 in the probe mounting plate 4 has been reduced to the minimum dimension required for the positioning of the probe tips.

In the configuration in accordance with FIG. 2, a central partial section of the probe chamber 3, in which section the probe arms 24 extend, is thermally shielded from the lateral partial sections, in which the probe heads 21 are arranged, by thermal diaphragms 31. The probes 23 held by the probe heads 21 extend through the diaphragms 31 right into the central region of the probe chamber 3. The diaphragms 31 are thermally insulating but permeable to a gas flow 11, which is produced separately by means of gas channels 32 in each partial section. In each partial section of the probe chamber 3, there is arranged in the upper region gas channel 32 having, along a generatrix, openings serving as gas inlet 12. This configuration of the gas inlet 12 permits a directed flow, e.g. with respect to the mounts of the probes 23 and the diaphragms 31. The gas channel 32 in the central partial section of the probe chamber 3 is configured in such a way that the gas flow 11 flows in the direction of the probes 23 but not into the central opening 26 since the temperature of the gas flow 11 can deviate significantly from that of the test substrate 7 and thermal stresses and displacements in the test substrate 7 and the probe tips 25 are thus avoided.

The direction of the gas flow 11 can furthermore be set and altered by means of gas channel 32 and/or by means of directed, nozzle-like openings in the gas channel 32. The use of a directed gas flow 11 which flows through the probe chamber 3 permits the target temperature regulation also of individual components with minimal influence on the temperature of the working region and of the test substrate 7 arranged there.

Provided that the temperature in the test chamber 2 is significantly above that in the probe chamber, the air flowing from the test chamber 2 additionally prevents the cooler gas flow 11 from penetrating into the test chamber 2. The gas flows 11 mixing in the central partial section of the probe chamber 3 escape through the diaphragms 31 into the lateral partial sections, are cooled further there and escape through the gas outlets 13 distributed at the base point of the upper housing wall 30, if appropriate in a manner supported by extraction by suction. If a measurement is carried out at 200 to 300° C., for example, the probe chamber 3 can be cooled by an air flow at room temperature and, with appropriate dimensioning of the amount of air flowing through the probe chamber 3, a temperature of approximately 25° C. can be maintained in the probe chamber 3 throughout the verification.

This is also supported the thermal separation by means of the diaphragms 31, which are removable in one configuration of a prober for flexible application. The use of diaphragms 31 depends firstly on the temperature difference and secondly on the size of the opening between the two chambers.

Both the gas flow 11 in the objective chamber 41 and that in the partial sections of the probe chamber 3 which lie laterally with respect thereto bring about a temperature regulation of the probe mounting plate 4, which has a stabilizing effect on the thermal equilibrium of the test system. In the above-described case of a high temperature difference between probe chamber 3 and test substrate 7, the probe mounting plate 4 can have a thermal insulation 27. In the exemplary embodiment, said thermal insulation is arranged at the underside of the probe mounting plate 4 owing to the mounting of the probes 23 and the probe heads 21 on said probe mounting plate. Alternatively, that is also possible above said plate.

In a further configuration, the housing of a prober, besides the function as EMI shielding, can also be embodied in light-tight fashion, e.g. for the verification of optoelectronic test substrates 7. FIG. 3 shows a possible gas outlet 13 that fulfills both functions. For this purpose, a profile 34 is inserted in an opening in the upper housing wall 30, which profile, by virtue of mutually overlapping webs, precludes direct visual contact through the opening but, by virtue of sufficiently large distances between the webs, allows a gas flow through the profile 34. For a maximum absorption of incident light, the profile 34 is produced from matt black material. The electromagnetic shielding in the region of the opening is realized by an EMI shielding substance 35, which is in electrical contact with the probe mounting plate 4 and the upper housing wall 30. Alternatively, the gas outlet 13 can also fulfill only one of the functions and, consequently, only have either the profile 34 or the electromagnetic shielding.

For the verification, which, in the exemplary embodiment, is intended to be carried out at temperatures above 200° C., a test substrate 7 is arranged on a chuck 5 and coarsely positioned in the working region within the test chamber 2 and thus below the central opening 26. Afterward, the test substrate 7 bearing on the chuck 5 in planar fashion is heated to the test temperature by means of a chuck heating system (not illustrated). At this point in time, three separate gas flows 11 composed of dried air at room temperature flow through the probe chamber 3, which is subdivided into three partial sections with a central objective chamber 41. Severe heating of the probes 23 and, via the thermal contact thereof, also of the probe heads 21 is prevented in this way. A thermal equilibrium is established in which the test substrate 7 has assumed the test temperature and a temperature of approximately 25° C. is set for the probes 23, the probe heads 21 and signal preprocessing units within the lateral partial sections of the probe chamber 3.

After the setting of the thermal equilibrium, the contact of the probes 23 with the test substrate is produced by fine positioning by means of chuck positioning unit 6 and probe heads 21 and the subsequent feed between the probes 23 and the test substrate 7. On account of the maintenance of the temperature of the probes 23 by means of the gas flows 11, the thermal expansion of the probes does not change, such that even long-term measurements and, in particular, also with long probe arms 24 are possible without losing the contact between the probes and the test substrate during verification.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

LIST OF REFERENCE SYMBOLS

1 Baseplate
2 Test chamber
3 Probe chamber
4 Probe mounting plate
5 Chuck
6 Chuck positioning unit
7 Test substrate
9 Shield
10 Lower housing wall
11 Gas flow
12 Gas inlet
13 Gas outlet
21 Probe head
23 Probe
24 Probe arm
25 Probe tip
26 Central opening
27 Thermal insulation
28 Apparatus for signal conditioning
29 Connector
30 Upper housing wall
31 Diaphragm
32 Gas channels
34 Profile
35 EMI shielding substance
40 Observation region
41 Objective chamber
43 Microscope

What is claimed is:

1. A method for verifying a test substrate in a prober under defined thermal conditions, wherein the prober has a housing having at least two housing sections, in one housing section of which, designated hereinafter as a test chamber, the test substrate to be verified is held by a chuck and is set to a defined temperature, and in the other housing section of which, designated hereinafter as a probe chamber, probes are held and positioned relative to one another by at least one positioning device, wherein the probes are configured to make contact with the test substrate for verification purposes, characterized in that:
the probes are set to a probe temperature that is independent of a temperature of the test substrate by gas flow that flows through the probe chamber, and this probe temperature is maintained.

2. The method as claimed in claim 1, characterized in that: a separate gas flow is in each case produced in two partial sections of the probe chamber.

3. The method as claimed in claim 1, characterized in that: a gas curtain is produced in the probe chamber.

4. The method as claimed in claim 1, characterized in that: further components of the prober, which are arranged in the probe chamber, are set to a component temperature that is independent of the temperature of the test substrate by the gas flow, and this component temperature of said further components is maintained.

5. The method as claimed in claim 1, characterized in that: the gas flow is directed onto a component in the probe chamber.

6. The method as claimed in claim 1, wherein the gas flow is a temperature-regulated gas flow.

7. The method as claimed in claim 1, wherein the probe temperature is maintained by the gas flow.

8. The method as claimed in claim 1, wherein the temperature of the test substrate is at least 200° C., and further wherein the probe temperature is 25° C.±5° C.

9. A prober for verifying test substrates under defined thermal conditions, said prober comprising a chuck for receiving a test substrate, a probe mounting plate on which are arranged probes for making electrical contact with the test substrate, at least one positioning system that positions the test substrate and the probes relative to one another, and a housing enclosing at least the chuck and the probes, said housing being subdivided into at least two housing sections, of which one housing section, designated hereinafter as a test chamber, encloses the test substrate, and the other housing section, designated hereinafter as a probe chamber, encloses the probes, characterized in that:
an apparatus for producing a gas flow that flows through the probe chamber is arranged; and
the probe chamber is subdivided into partial sections by gas-permeable diaphragms.

10. The prober as claimed in claim 9, characterized in that:
the apparatus has a gas inlet into the probe chamber that is configured to produce a directed gas stream.

11. The prober as claimed in claim 9, characterized in that:
at least two partial sections of the probe chamber have a dedicated apparatus for producing a gas flow that flows through the partial sections.

12. The prober as claimed in claim 9, characterized in that:
the housing forms an electromagnetic shielding.

13. The prober as claimed in claim 12, characterized in that:
at least one housing section forms relative to another the same electromagnetic shielding as the housing with respect to the surroundings.

14. The prober as claimed in claim 12, characterized in that:
the housing has a gas outlet that includes an outlet electromagnetic shielding.

15. The prober as claimed in claim 9, characterized in that:
the housing is a light-tight housing.

16. The prober as claimed in claim 15, characterized in that:
at least one housing section is light-tight relative to another.

17. The prober as claimed in claim 15, characterized in that:
the housing has a light-tight gas outlet.

18. The prober as claimed in claim 15, characterized in that:
a separation between the test chamber and the probe chamber has a thermal insulation.

19. A prober for verifying a test substrate under defined thermal conditions, the prober comprising:
a chuck configured to receive the test substrate;

a probe mounting plate configured to support a plurality of probes, wherein the plurality of probes is configured to make electrical contact with the test substrate;

at least one positioning system configured to position the test substrate and the plurality of probes relative to one another;

a housing that encloses the chuck and the plurality of probes, wherein the housing is subdivided into two housing sections, including:

a test chamber that encloses the test substrate; and a probe chamber that at least partially encloses the plurality of probes; and means for utilizing a gas flow to set a temperature of the plurality of probes independent from a temperature of the test substrate.

20. The prober as claimed in claim 19, wherein the probe mounting plate extends between the test chamber and the probe chamber.

21. The probe of claim 19, wherein the probe mounting plate includes a central opening that is configured to permit the plurality of probes to extend from the probe chamber into the test chamber to contact the test substrate.

22. The prober as claimed in claim 19, wherein the prober further includes a plurality of probe heads that is configured to mount the plurality of probes to the probe mounting plate, and further wherein the prober includes means for setting a temperature of the plurality of probe heads independent from the temperature of the test substrate.

* * * * *